United States Patent
Alijani et al.

(10) Patent No.: US 10,868,525 B2
(45) Date of Patent: Dec. 15, 2020

(54) POWER TRANSMISSION THROUGH A SINGLE CONDUCTIVE ELEMENT

(71) Applicants: Mohammad GH. Alijani, Ghaemshahr (IR); Nastaran Soleimani, Ghaemshahr (IR); Mohammad H. Neshati, Mashhad (IR)

(72) Inventors: Mohammad GH. Alijani, Ghaemshahr (IR); Nastaran Soleimani, Ghaemshahr (IR); Mohammad H. Neshati, Mashhad (IR)

( * ) Notice: Subject to any disclaimer, the term of this patent is extended or adjusted under 35 U.S.C. 154(b) by 0 days.

(21) Appl. No.: 16/681,883

(22) Filed: Nov. 13, 2019

(65) Prior Publication Data

US 2020/0083870 A1    Mar. 12, 2020

Related U.S. Application Data

(60) Provisional application No. 62/760,067, filed on Nov. 13, 2018.

(51) Int. Cl.
| | | |
|---|---|---|
| *H02J 3/00* | (2006.01) |
| *H03K 3/282* | (2006.01) |
| *G01R 19/165* | (2006.01) |
| *G01R 19/02* | (2006.01) |
| *G06K 19/077* | (2006.01) |

(52) U.S. Cl.
CPC ........... *H03K 3/2825* (2013.01); *G01R 19/02* (2013.01); *G01R 19/1658* (2013.01); *G06K 19/07771* (2013.01); *H02J 3/00* (2013.01)

(58) Field of Classification Search
CPC .... H03K 3/282; H03K 3/2821; H03K 3/2823; H03K 3/2825; H03K 3/2826; H03K 3/2828; H03K 3/354; H02J 3/00; H02J 13/0006; H02J 2203/00
USPC ......................................................... 331/113 R
See application file for complete search history.

(56) References Cited

U.S. PATENT DOCUMENTS

| | | | | |
|---|---|---|---|---|
| 3,217,268 | A * | 11/1965 | Hu ......................... | H03K 3/315 331/107 R |
| 3,515,995 | A * | 6/1970 | Kulp ....................... | H03K 3/33 327/171 |
| 4,577,118 | A * | 3/1986 | Rummler ................. | H03K 3/57 307/106 |
| 4,725,769 | A * | 2/1988 | Cini ........................ | H02H 3/087 323/283 |
| 4,748,532 | A * | 5/1988 | Commander ....... | H02M 7/5387 323/289 |
| 8,536,819 | B2 * | 9/2013 | Ohshima .................. | H02P 7/29 318/599 |

(Continued)

*Primary Examiner* — Levi Gannon
(74) *Attorney, Agent, or Firm* — Bajwa IP Law Firm; Haris Zaheer Bajwa

(57) ABSTRACT

A circuit for power transmission through a single conductive element. The circuit includes an oscillator, a single conductive element, and a load. The oscillator is configured to generate a periodic voltage. The single conductive element is connected in series with the oscillator. The load is connected in series with the single conductive element. The load includes a first diode, a first resistor, and a first inductor. The first diode is connected in series with the single conductive element. The first resistor is connected in series with the first diode. The first inductor is connected between the first diode and the single conductive element. The first inductor is connected in series with the first resistor.

14 Claims, 7 Drawing Sheets

100

(56) References Cited

U.S. PATENT DOCUMENTS

2009/0302774 A1* 12/2009 Mednik .................. H05B 45/37
   315/209 R
2018/0143227 A1* 5/2018 Novak ............... G01R 19/2513

* cited by examiner

POWER TRANSMISSION THROUGH A SINGLE CONDUCTIVE ELEMENT

CROSS-REFERENCE TO RELATED APPLICATION

This application claims the benefit of priority from U.S. Provisional Patent Application Ser. No. 62/760,067, filed on Nov. 13, 2018, and entitled "GRAUND-INDEPENDENT SINGLE-WIRE TRANSMISSION LINE," which is incorporated herein by reference in its entirety.

TECHNICAL FIELD

The present disclosure generally relates to power systems, and particularly, to power transmission systems.

BACKGROUND

Transmission lines are used for carrying electrical signals from one point to another. Conventional transmission lines, such as twisted pairs and coaxial cables, may include two conductive elements, such as wires, for transmission of electrical signals in forward and backward directions. Using two wires, however, may lead to high implementation costs and exposure to risks such as fire due to connection of wires. Transmission lines with a single wire may be capable of carrying electrical signals. However, such transmission lines may depend on a connection to ground as a voltage reference, which may limit applications with portability requirements. There is, therefore, a need for a ground-independent circuit for power transmission through a single conductive element.

SUMMARY

This summary is intended to provide an overview of the subject matter of the present disclosure, and is not intended to identify essential elements or key elements of the subject matter, nor is it intended to be used to determine the scope of the claimed implementations. The proper scope of the present disclosure may be ascertained from the claims set forth below in view of the detailed description below and the drawings.

In one general aspect, the present disclosure describes an exemplary circuit for power transmission through a single conductive element. In an exemplary embedment, the circuit may include an oscillator, a single conductive element, and a load. In an exemplary embodiment, the oscillator may be configured to generate a periodic voltage. In an exemplary embodiment, the single conductive element may be connected in series with the oscillator. In an exemplary embodiment, the load may be connected in series with the single conductive element. In an exemplary embodiment, the load may include a first diode, a first resistor, and a first inductor. In an exemplary embodiment, the first diode may be connected in series with the single conductive element. In an exemplary embodiment, the first resistor may be connected in series with the first diode. In an exemplary embodiment, the first inductor may be connected between the first diode and the single conductive element. In an exemplary embodiment, the first inductor may be connected in series with the first resistor.

In an exemplary embodiment, the periodic voltage may include one of a sinusoidal wave and a rectangular wave. In an exemplary embodiment, a pulse width w of the rectangular pulse wave may satisfy a condition defined by $w < 5L_1/R_1$, where $L_1$ is an induction of the first inductor and $R_1$ is a resistance of the first resistor.

In an exemplary embodiment, the oscillator may include an astable multivibrator. In an exemplary embodiment, the astable multivibrator may include a DC voltage supply, a first transistor, a second transistor, a second inductor, a third inductor, a second resistor, a third resistor, a first capacitor, and a second capacitor. In an exemplary embodiment, the DC voltage supply may include a positive pole and a negative pole. In an exemplary embodiment, the first transistor may include a first base, a first collector, and a first emitter. In an exemplary embodiment, the first collector may be connected to the single conductive element. In an exemplary embodiment, the first emitter may be connected to the negative pole. In an exemplary embodiment, the second transistor may include a second base, a second collector, and a second emitter. In an exemplary embodiment, the second emitter may be connected to the negative pole. In an exemplary embodiment, the second inductor may be connected between the first collector and the positive pole. In an exemplary embodiment, the third inductor may be connected between the second collector and the positive pole. In an exemplary embodiment, the second resistor may be connected between the first base and the second collector. In an exemplary embodiment, the third resistor may be connected between the second base and the first collector. In an exemplary embodiment, the first capacitor may be connected in parallel with the second resistor. In an exemplary embodiment, the second capacitor may be connected in parallel with the third resistor.

In an exemplary embodiment, the load may further include a second diode. In an exemplary embodiment, the second diode may be connected between the first inductor and the single conductive element. In an exemplary embodiment, the circuit may further include a fourth resistor. In an exemplary embodiment, the fourth resistor may be connected in parallel with the oscillator.

Other exemplary systems, methods, features and advantages of the implementations will be, or will become, apparent to one of ordinary skill in the art upon examination of the following figures and detailed description. It is intended that all such additional systems, methods, features and advantages be included within this description and this summary, be within the scope of the implementations, and be protected by the claims herein.

BRIEF DESCRIPTION OF THE DRAWINGS

The drawing figures depict one or more implementations in accord with the present teachings, by way of example only, not by way of limitation. In the figures, like reference numerals refer to the same or similar elements.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings.

The following detailed description is presented to enable a person skilled in the art to make and use the methods and devices disclosed in exemplary embodiments of the present disclosure. For purposes of explanation, specific nomenclature is set forth to provide a thorough understanding of the present disclosure. However, it will be apparent to one skilled in the art that these specific details are not required to practice the disclosed exemplary embodiments. Descriptions of specific exemplary embodiments are provided only as representative examples. Various modifications to the exemplary implementations will be readily apparent to one skilled in the art, and the general principles defined herein may be applied to other implementations and applications without departing from the scope of the present disclosure. The present disclosure is not intended to be limited to the implementations shown but is to be accorded the widest possible scope consistent with the principles and features disclosed herein.

Herein is disclosed an exemplary circuit and method for power transmission through a single conductive element. An exemplary circuit may include an oscillator, a single conductive element, and a load, that may be connected in series. An exemplary oscillator may apply a voltage with a sinusoidal or a rectangular pulse shape to the single conductive element. As a result, an exemplary inductor embedded in the load may gradually become charged and a current may pass through the single conductive element. After a transient time, an exemplary inductor may be fully charged. Therefore, the current passing through the single conductive element may vanish. However, by reversing an output voltage of the oscillator, the inductor may start discharging, and consequently, a current in a reverse direction, i.e., from the load toward the oscillator, may pass through the single conductive element. As a result, by applying an alternative voltage to the single conductive element, an electric current may continuously pass through the single conductive element, leading to a continuous power transmission to the load.

Figure 1A:
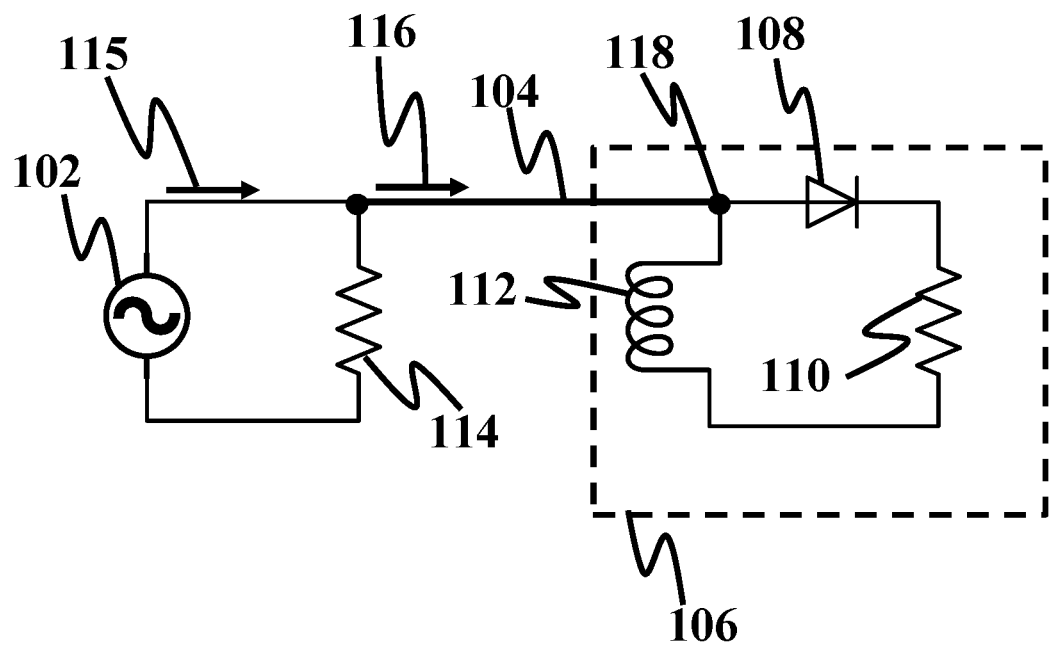
FIG. 1A shows a schematic of a simplified circuit for power transmission through a single conductive element, consistent with one or more exemplary embodiments of the present disclosure.

FIG. 1A shows a schematic of a circuit for power transmission through a single conductive element, consistent with one or more exemplary embodiments of the present disclosure. An exemplary circuit 100 may include an oscillator 102, a single conductive element 104, and a load 106. In an exemplary embodiment, oscillator 102 may be configured to generate a periodic voltage. In an exemplary embodiment, single conductive element 104 may be connected in series with oscillator 102. In an exemplary embodiment, load 106 may be connected in series with single conductive element 104. In an exemplary embodiment, load 106 may include a diode 108, a resistor 110, and an inductor 112. In an exemplary embodiment, diode 108 may be connected in series with single conductive element 104. In an exemplary embodiment, resistor 110 may be connected in series with diode 108. In an exemplary embodiment, inductor 112 may be connected between diode 108 and single conductive element 104. In an exemplary embodiment, inductor 112 may be connected in series with resistor 110. In an exemplary embodiment, circuit 100 may further include a resistor 114 connected in parallel with oscillator 102.

Figure 2:
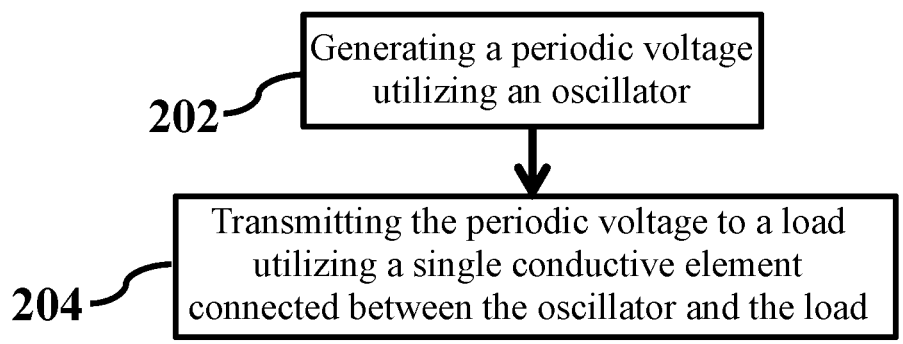
FIG. 2 shows a flowchart of a method for power transmission through a single conductive element, consistent with one or more exemplary embodiments of the present disclosure.

FIG. 2 shows a flowchart of a method for power transmission through a single conductive element, consistent with one or more exemplary embodiments of the present disclosure. In an exemplary embodiment, different steps of a method 200 may be implemented utilizing a circuit analogous to circuit 100. In an exemplary embodiment, method 200 may include generating a periodic voltage utilizing an oscillator (step 202) and transmitting the periodic voltage to a load utilizing a single conductive element connected between the oscillator and the load (step 204). In an exemplary embodiment, the oscillator may be analogous to oscillator 102. In an exemplary embodiment, the load may be analogous to load 106. In an exemplary embodiment, the single conductive element may be analogous to single conductive element 104. In an exemplary embodiment, generating the periodic voltage in step 202 may include coupling resistor 114 in parallel with oscillator 102.

In an exemplary embodiment, a source current 115 may be generated by oscillator 102. In an exemplary embodiment, a large resistance may be chosen for resistor 114 to prevent electric charges to flow toward resistor 114. Therefore, source current 115 may approximately equal a transmission line current 116, which may pass through single conductive element 104. In an exemplary embodiment, inductor 112 may be discharged before applying a voltage by oscillator 102. Therefore, inductor 112 may act as an open circuit at a beginning of a transient time, which may prevent transmission line current 116 to flow from a load point 118 toward resistor 110 through inductor 112. On the other hand, diode 108 may pass transmission line current 116 in only one direction, i.e., from load point 118 toward resistor 110 through diode 108. As a result, transmission line current 116 may pass through resistor 110 and may gradually charge inductor 112. This process may continue until inductor 112 becomes fully charged. In an exemplary embodiment, inductor 112 may act as a short circuit, and consequently, resistor 110 may be short-circuited. As a result, transmission line current 116 may not pass resistor 110 and therefore, no power may be transmitted to resistor 110. In an exemplary embodiment, an applied voltage by oscillator 102 may become less than a voltage of inductor 112. As a result, a voltage of load point 118 may be larger than an applied voltage by oscillator 102. Therefore, transmission line current 116 may be transmitted in a reverse direction, i.e., from load point 118 toward oscillator 102. This process may continue until inductor 112 may become discharged, and consequently, no transmission line current 116 may be transmitted through single conductive element 104. In an exemplary embodiment, changing a voltage level by oscillator 102 may lead to a different value of transmission line current 116. Therefore, applying a periodic voltage by oscillator 102 with appropriate rise and fall timing may result in a continuous transmission line current 116 through single conductive element 104.

Figure 3:
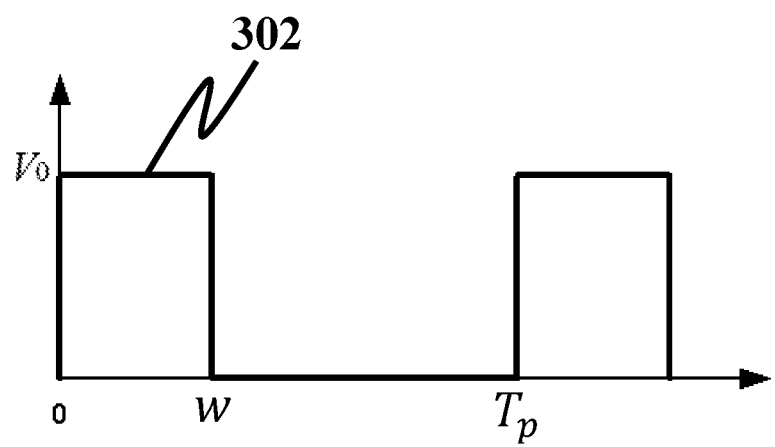
FIG. 3 shows a schematic of a rectangular pulse wave, consistent with one or more exemplary embodiments of the present disclosure.

For further detail with respect to step 202, in an exemplary embodiment, generating the periodic voltage may include generating one of a sinusoidal wave and a rectangular wave. FIG. 3 shows a schematic of a rectangular pulse wave, consistent with one or more exemplary embodiments of the present disclosure. In an exemplary embodiment, the rectangular pulse wave may be similar to rectangular pulse wave 302. In an exemplary embodiment, a pulse width w of the rectangular pulse wave may satisfy a condition defined by $w<5L_1/R_1$, where $L_1$ is an induction of inductor 112 and $R_1$ is a resistance of resistor 110. In an exemplary embodiment, rectangular pulse wave 302 may further include a period $T_p$. Referring to FIGS. 1A and 3, in an exemplary embodiment, oscillator 102 may apply a constant voltage in a time duration w. In an exemplary embodiment, inductor 112 may be discharged before applying the constant voltage. Therefore, transmission line current 116 may pass through single conductive element 104 and charge inductor 112. In an exemplary embodiment, a charging rate of inductor 112 may depend on resistance $R_1$ of resistor 110 and induction $L_1$ of inductor 112. The charging rate of inductor 112 may have an inverse relationship with a time constant $L_1/R_1$. In an exemplary embodiment, inductor 112 may be almost fully charged after five time constants. Therefore, a voltage of first inductor may become nearly zero. As a result, resistor 110 may be short circuited, and consequently, no current may pass through resistor 110. In an exemplary embodiment, pulse width w of rectangular pulse wave 302 may be set lower than $5L_1/R_1$ to keep an electric current pass through resistor 110. In an exemplary embodiment, a constant voltage may be removed after a time duration w. In this case, inductor 112 may be discharged by dissipating a stored energy of inductor 112 by resistor 110. A discharging rate of inductor 112 may have an inverse relationship with the time constant $L_1/R_1$. In an exemplary embodiment, inductor 112 may be almost fully discharged after five time constants. Therefore, in an exemplary embodiment, a pulse-off time of rectangular pulse wave 302, which equals $T_p-w$, may be sufficiently large to fully discharge inductor 112.

Figure 4:
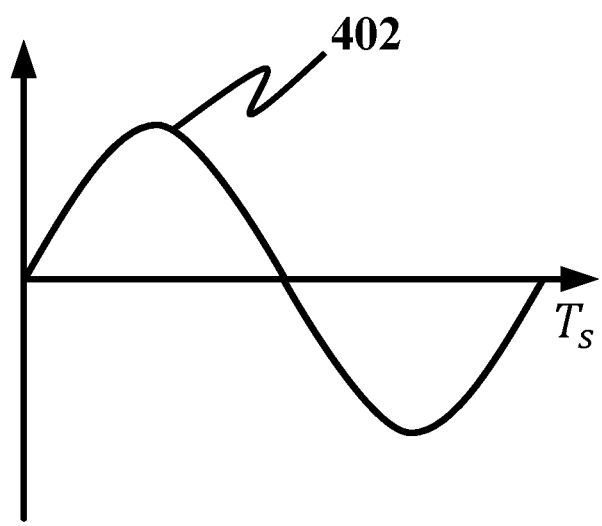
FIG. 4 shows a schematic of a sinusoidal wave, consistent with one or more exemplary embodiments of the present disclosure.

FIG. 4 shows a schematic of a sinusoidal wave, consistent with one or more exemplary embodiments of the present disclosure. In an exemplary embodiment, the sinusoidal wave may have a shape similar to sinusoidal wave 402. In an exemplary embodiment, oscillator 102 may be configured to generate a periodic voltage including sinusoidal wave 402. In an exemplary embodiment, the periodic voltage may be applied to load point 118. In an exemplary embodiment, inductor 112 may be discharged before applying sinusoidal wave 402. In an exemplary embodiment, when the periodic voltage is increasing, inductor 112 may be charged due to a positive voltage applied to inductor 112. Therefore, transmission line current 116 may pass through single conductive element 104 to charge inductor 112. In an exemplary embodiment, when a period $T_s$ is large, inductor 112 may be fully charged, and consequently, resistor 110 may act as a short circuit. Consequently, no current may pass through single conductive element 104 and transmission line current 116 may vanish. On the other hand, in an exemplary embodiment, when an amplitude of sinusoidal wave 402 decreases, a voltage of inductor 112 may be larger than an amplitude of sinusoidal wave 402. Therefore, inductor 112 may be discharged and transmission line current 116 may pass through single conductive element 104 in a reverse direction. Therefore, by choosing an appropriate period $T_s$, a continuous transmission line current 116 may pass through single conductive element 104.

Figure 1B:
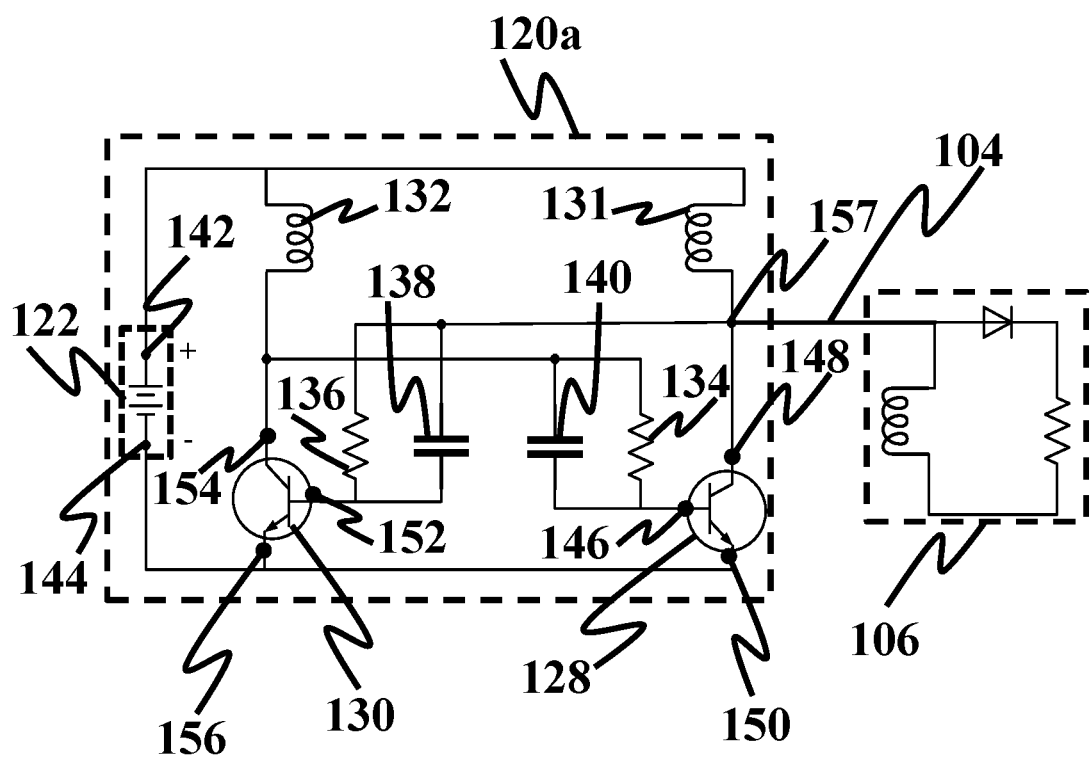
FIG. 1B shows a schematic of an astable multivibrator, consistent with one or more exemplary embodiments of the present disclosure.

FIG. 1B shows a schematic of an astable multivibrator, consistent with one or more exemplary embodiments of the present disclosure. In an exemplary embodiment, oscillator 102 may include an astable multivibrator 120a. In an exemplary embodiment, astable multivibrator 120a may include a DC voltage supply 122, a transistor 128, a transistor 130, an inductor 131, an inductor 132, a resistor 134, a resistor 136, a capacitor 138, and a capacitor 140. In an exemplary embodiment, DC voltage supply 122 may include a positive pole 142 and a negative pole 144. In an exemplary embodiment, transistor 128 may include a base 146, a collector 148, and an emitter 150. In an exemplary embodiment, collector 148 may be connected to single conductive element 104. In an exemplary embodiment, emitter 150 may be connected to negative pole 144. In an exemplary embodiment, transistor 130 may include a base 152, a collector 154, and an emitter 156. In an exemplary embodiment, emitter 156 may be connected to negative pole 144. In an exemplary embodiment, inductor 131 may be connected between collector 148 and positive pole 142. In an exemplary embodiment, inductor 132 may be connected between collector 154 and positive pole 142. In an exemplary embodiment, resistor 134 may be connected between base 146 and collector 154. In an exemplary embodiment, resistor 136 may be connected between base 152 and collector 148. In an exemplary embodiment, capacitor 138 may be connected in parallel with resistor 136. In an exemplary embodiment, capacitor 140 may be connected in parallel with resistor 134. In an exemplary embodiment, an output node 157 may be referred to a node at which an output voltage of oscillator 102 may be obtained. In an exemplary embodiment, output node 157 may be connected to collector 148. In an exemplary embodiment, output node 157 may also be connected to single conductive element 104. For further detail with respect to step 202, generating the periodic voltage utilizing the oscillator may include generating the period voltage utilizing an astable multivibrator. In an exemplary embodiment, the astable multivibrator may be analogous to astable multivibrator 120a.

Referring to FIGS. 1B and 3, in an exemplary embodiment, astable multivibrator 120a may provide rectangular pulse wave 302. In an exemplary embodiment, rectangular pulse wave 302 may be provided at output node 157. In an exemplary embodiment, resistor 134 may include a resistance $R_2$. In an exemplary embodiment, capacitor 140 may include a capacitance $C_1$. In an exemplary embodiment, pulse width w may be determined by a time constant of parallel resistor 134 and capacitor 140, which may equal $R_2C_1$. In an exemplary embodiment, pulse width w may approximately equal $0.69\ R_2C_1$. In an exemplary embodiment, resistor 136 may include a resistance $R_3$. In an exemplary embodiment, capacitor 138 may include a capacitance $C_2$. In an exemplary embodiment, pulse-off time may be determined by a time constant of parallel resistor 136 and capacitor 138, which may equal $R_3 C_2$. In an exemplary embodiment, pulse width w may approximately equal $0.69 R_3C_2$. In an exemplary embodiment, period $T_p$ may approximately equal $0.69(R_2C_1+R_3C_2)$. In an exemplary embodiment, inductor 31 may include an inductance $L_2$. In an exemplary embodiment, inductor 132 may include an inductance $L_3$. In an exemplary embodiment, inductance $L_2$ and inductance $L_3$ may be chosen very large, forcing electric charges to flow through single conductive element 104.

Figure 1C:
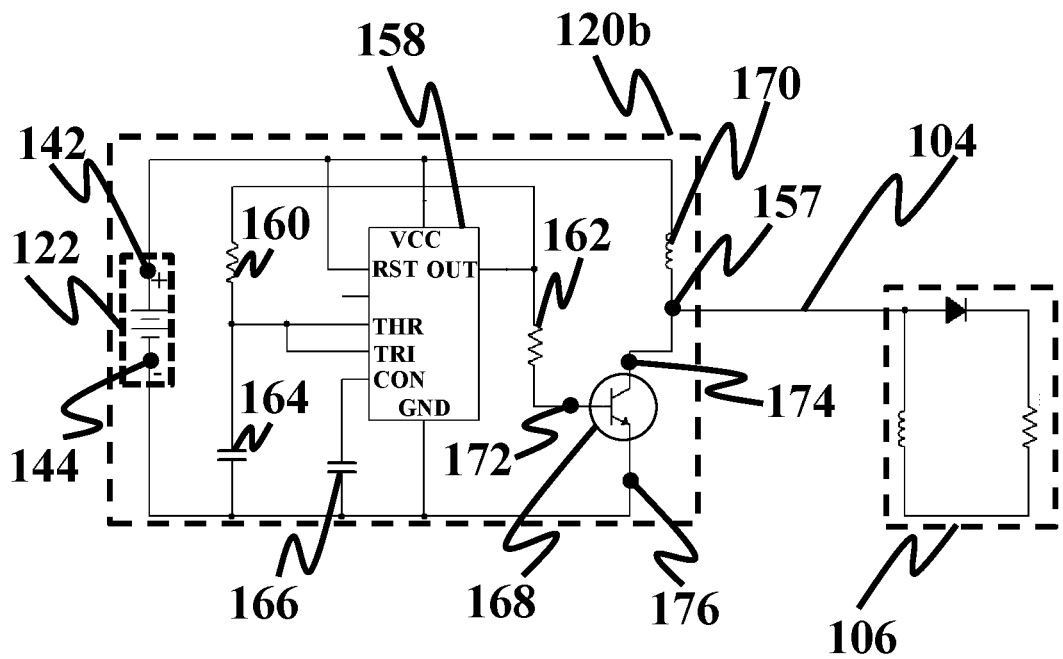
FIG. 1C shows a schematic of an astable multivibrator utilizing a 555 Timer integrated circuit, consistent with one or more exemplary embodiments of the present disclosure.

FIG. 1C shows a schematic of an astable multivibrator utilizing a 555 Timer integrated circuit (IC), consistent with one or more exemplary embodiments of the present disclosure. In an exemplary embodiment, astable multivibrator 120b may be implemented utilizing a 555 Timer IC. In an exemplary embodiment, astable multivibrator 120b may include DC voltage supply 122, output node 157, a 555 Timer IC 158, a resistor 160, a resistor 162, a capacitor 164, a capacitor 166, a transistor 168, and an inductor 170. In an exemplary embodiment, 555 Timer IC 158 may include a power supply pin VCC, a reset pin RST, a threshold pin THR, a trigger pin TRI, a control voltage pin CON, a ground pin GND, and an output pin OUT. In an exemplary embodiment, transistor 168 may include a base 172, a collector 174, and an emitter 176. In an exemplary embodiment, reset pin RST may be connected to power supply pin VCC. In an exemplary embodiment, trigger pin TRI may be connected to threshold pin THR. In an exemplary embodiment, positive pole 142 may be connected to power supply pin VCC. In an exemplary embodiment, negative pole 144 may be connected to ground pin GND. In an exemplary embodiment, resistor 160 may be connected between threshold pin THR and output pin OUT. In an exemplary embodiment, resistor 162 may be connected between output pin OUT and base 172. In an exemplary embodiment, capacitor 164 may be connected between threshold pin THR and ground pin GND. In an exemplary embodiment, capacitor 166 may be connected between control voltage pin CON and ground pin GND. In an exemplary embodiment, inductor 170 may be connected between collector 174 and power supply pin VCC. In an exemplary embodiment, collector 174 may be connected to output node 157. In an exemplary embodiment, emitter 176 may be connected to ground pin GND. In an exemplary embodiment, astable multivibrator 120b may provide rectangular pulse wave 302 at output node 157.

Figure 1D:
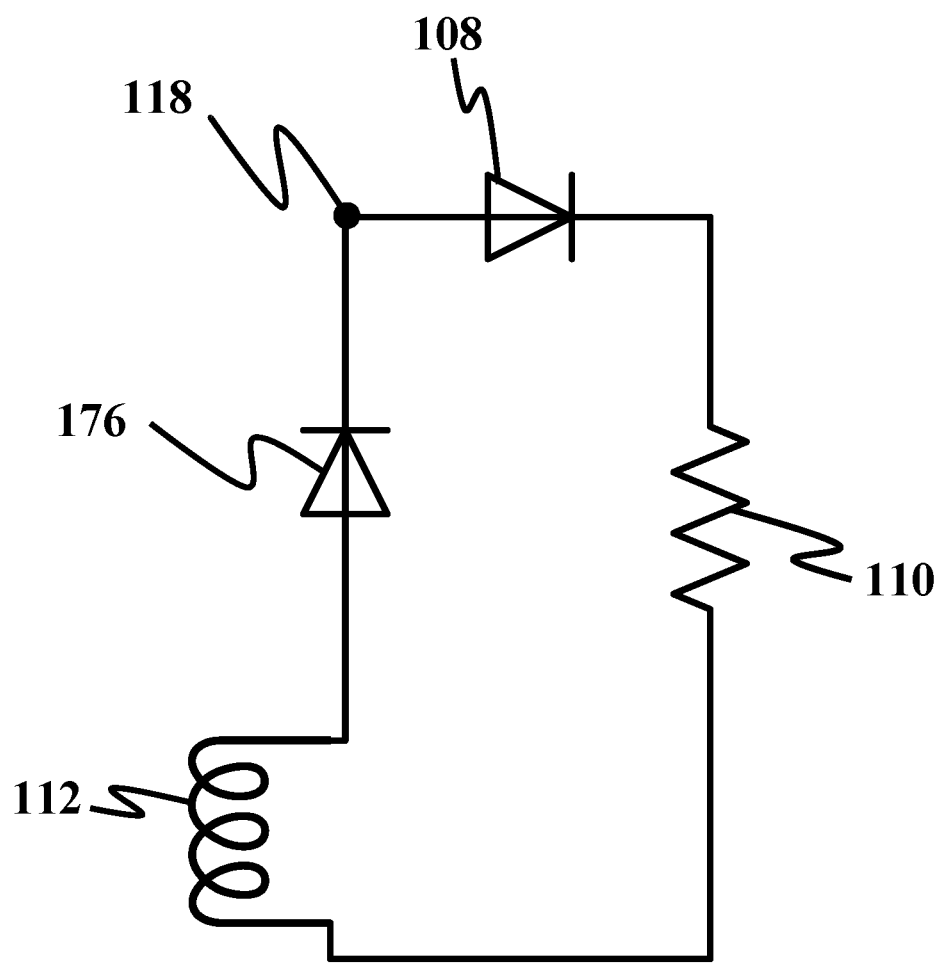
FIG. 1D shows a schematic of a load, consistent with one or more exemplary embodiments of the present disclosure.

FIG. 1D shows a schematic of a load, consistent with one or more exemplary embodiments of the present disclosure. In an exemplary embodiment, load 106 may further include a diode 119. In an exemplary embodiment, diode 178 may be connected between inductor 112 and the single conductive element 104. When inductor 112 is charged, inductor 112 may become conductive. As a result, transmission line current 116 may flow from load point 118 to resistor 110 through inductor 112. In this case, inserting diode 178 may avoid transmission line current 116 to flow from load point 118 to resistor 110 through inductor 112.

For further detail with respect to step 204, in an exemplary embodiment, transmitting the periodic voltage to the load may include transmitting the periodic voltage to a diode analogous to diode 178.

Example 1

In this example, a circuit including an oscillator, a single conductive element connected in series with the single conductive element, and a load connected in series with the single conductive element is demonstrated. An exemplary circuit includes an oscillator (analogous to oscillator 102), a single conductive element (analogous to single conductive element 104), and a load (analogous to load 106). The oscillator is configured to generate a rectangular pulse wave (analogous to rectangular pulse wave 302). The oscillator includes an astable multivibrator (analogous to astable multivibrator 120a). Transistor 128 and transistor 130 are of type 2N2222. Table 1 shows a set of elements of the circuit and their associated values. With this setting, a pulse width w of the rectangular pulse wave is about $0.69 \times 10^3 \times 10^{-7} \approx 0.07$ ms. Due to the symmetry of the astable multivibrator, a duty cycle of the rectangular pulse wave, i.e., $$\frac{w}{T_p},$$

is about 0.5. Moreover, a time constant of the load is about $$\frac{10^{-3}}{10} = 0.1 \text{ ms},$$

which satisfies the condition $$w \leq 5 \frac{L_1}{R_1}.$$

Therefore, a current continuously passes through the LED. Therefore, the LED stays turned on until a DC voltage supply (analogous to DC voltage supply 122) is switched on.

TABLE 1

A set of elements of the circuit and their associated values

| Element | Approximate Value |
|---|---|
| DC voltage supply 122 | 12 V |
| resistor 110 | 10 Ω |
| inductor 112 | 1 mH |
| inductor 131 | 1 mH |
| inductor 132 | 1 mH |
| resistor 134 | 1 kΩ |
| resistor 136 | 1 kΩ |
| capacitor 138 | 100 nF |
| capacitor 140 | 100 nF |

Example 2

In this example, a circuit including an oscillator, a single conductive element connected in series with the single conductive element, and a load connected in series with the single conductive element is demonstrated. An exemplary circuit includes an oscillator (analogous to oscillator 102), a single conductive element (analogous to single conductive element 104), and a load (analogous to load 106). The oscillator is configured to generate a rectangular pulse wave (analogous to rectangular pulse wave 302) with a period of about 0.14 ms. The duty cycle of the rectangular pulse wave, i.e., $$\frac{w}{T_p},$$

is about 0.5. The oscillator includes an astable multivibrator (analogous to astable multivibrator 120b) utilizing a 555 Timer IC (analogous to 555 Timer IC 158). The utilized 555 Timer IC is of type NE 555. A transistor (analogous to transistor 168) of the astable multivibrator is of type TIP 122. A diode (analogous to diode 108) of the load is of type 1N4148. A resistor (analogous to resistor 110) of the load is implemented utilizing a light-emitting diode (LED). Table 2 shows a set of elements of the circuit and their associated values. With this setting, a time constant of the load is about $$\frac{10^{-3}}{10} = 0.1 \text{ ms},$$

which satisfies the condition $$w \leq 5\frac{L_1}{R_1}.$$

Therefore, a current continuously passes through the LED and it stays turned on until a DC voltage supply (analogous to DC voltage supply 122) is switched on.

TABLE 2

A set of elements of the circuit and their associated values

| Element | Approximate Value |
| --- | --- |
| DC voltage supply 122 | 12 V |
| inductor 112 | 1 mH |
| resistor 160 | 1 kΩ |
| resistor 162 | 470 Ω |
| capacitor 164 | 100 nF |
| capacitor 166 | 100 nF |
| Inductor 170 | 100 μH |
| resistor 110 | 10 Ω |

While the foregoing has described what may be considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various implementations. This is for purposes of streamlining the disclosure, and is not to be interpreted as reflecting an intention that the claimed implementations require more features than are expressly recited in each claim. Rather, as the following claims reflect, inventive subject matter lies in less than all features of a single disclosed implementation. Thus, the following claims are hereby incorporated into the Detailed Description, with each claim standing on its own as a separately claimed subject matter.

While various implementations have been described, the description is intended to be exemplary, rather than limiting and it will be apparent to those of ordinary skill in the art that many more implementations and implementations are possible that are within the scope of the implementations. Although many possible combinations of features are shown in the accompanying figures and discussed in this detailed description, many other combinations of the disclosed features are possible. Any feature of any implementation may be used in combination with or substituted for any other feature or element in any other implementation unless specifically restricted. Therefore, it will be understood that any of the features shown and/or discussed in the present disclosure may be implemented together in any suitable combination. Accordingly, the implementations are not to be restricted except in light of the attached claims and their equivalents. Also, various modifications and changes may be made within the scope of the attached claims.

What is claimed is:

1. A circuit for power transmission through a single conductive element, the circuit comprising:
    an astable multivibrator configured to generate a periodic voltage, the periodic voltage comprising a rectangular wave;
    a single conductive element connected in series with the astable multivibrator;
    a load connected in series with the single conductive element, the load comprising:
        a first diode connected in series with the single conductive element;
        a first resistor connected in series with the first diode;
        a first inductor connected between the first diode and the single conductive element, the first inductor connected in series with the first resistor;
        a second diode connected between the first inductor and the single conductive element; and
        a second resistor connected in parallel with the astable multivibrator;

wherein a pulse width w of the rectangular wave satisfies a condition defined by the following:

$w<5L_1/R_1$, where:
$L_1$ is an induction of the first inductor; and
$R_1$ is a resistance of the first resistor.

2. A circuit for power transmission through a single conductive element, the circuit comprising:
an oscillator configured to generate a periodic voltage;
a single conductive element connected in series with the oscillator, the single conductive element configured to receive a transmission line current from the oscillator;
a load connected in series with the single conductive element, the load comprising:
a first diode connected in series with the single conductive element;
a first resistor connected in series with the first diode; and
a first inductor connected between the first diode and the single conductive element, the first inductor connected in series with the first resistor.

3. The circuit of claim 2, wherein the periodic voltage comprises one of a sinusoidal wave and a rectangular wave.

4. The circuit of claim 3, wherein a pulse width w of the rectangular wave satisfies a condition defined by the following:

$w<5L_1/R_1$, where:
$L_1$ is an induction of the first inductor; and
$R_1$ is a resistance of the first resistor.

5. The circuit of claim 2, wherein the oscillator comprises an astable multivibrator, comprising:
a DC voltage supply comprising a positive pole and a negative pole;
a first transistor comprising:
a first base;
a first collector connected to the single conductive element; and
a first emitter connected to the negative pole;
a second transistor comprising:
a second base;
a second collector; and
a second emitter connected to the negative pole;
a second inductor connected between the first collector and the positive pole;
a third inductor connected between the second collector and the positive pole;
a second resistor connected between the first base and the second collector;
a third resistor connected between the second base and the first collector;
a first capacitor connected in parallel with the second resistor; and
a second capacitor connected in parallel with the third resistor.

6. The circuit of claim 2, wherein the load further comprises a second diode connected between the first inductor and the single conductive element.

7. The circuit of claim 2, further comprising a fourth resistor connected in parallel with the oscillator.

8. The circuit of claim 2, wherein the transmission line current is configured to flow through the single conductive element to a load point and from the load point to the first resistor and the first inductor through the first diode.

9. A method for power transmission through a single conductive element, the method comprising:
generating a transmission line current by generating a periodic voltage utilizing an oscillator; and
transmitting the periodic voltage to a load by passing the transmission line current to the load through a single conductive element connected between the oscillator and the load, passing the transmission line current to the load comprising:
passing the transmission line current to a first diode connected in series with the single conductive element;
passing the transmission line current through the first diode to a first resistor connected in series with the first diode; and
passing the transmission line current through the first diode to a first inductor connected between the first diode and the single conductive element, the first inductor connected in series with the first resistor.

10. The method of claim 9, wherein generating the periodic voltage comprises generating one of a sinusoidal wave and a rectangular wave.

11. The method of claim 10, wherein a pulse width w of the rectangular wave satisfies a condition defined by the following:

$w<5L_1/R_1$, where:
$L_1$ is an induction of the first inductor; and
$R_1$ is a resistant of the first resistor.

12. The method of claim 9, wherein generating the periodic voltage utilizing the oscillator comprises generating the periodic voltage utilizing an astable multivibrator, the astable multivibrator comprising:
a DC voltage supply comprising a positive pole and a negative pole;
a first transistor comprising:
a first base;
a first collector connected to the single conductive element; and
a first emitter connected to the negative pole;
a second transistor comprising:
a second base;
a second collector; and
a second emitter connected to the negative pole;
a second inductor connected between the first collector and the positive pole;
a third inductor connected between the second collector and the positive pole;
a second resistor connected between the first base and the second collector;
a third resistor connected between the second base and the first collector;
a first capacitor connected in parallel with the second resistor; and
a second capacitor connected in parallel with the third resistor.

13. The method of claim 9, wherein transmitting the periodic voltage to the load comprises transmitting the periodic voltage to a second diode connected between the first inductor and the single conductive element.

14. The method of claim 9, wherein generating the periodic voltage comprises coupling a fourth resistor in parallel with the oscillator.

* * * * *